United States Patent
Ho et al.

(10) Patent No.: US 7,253,112 B2
(45) Date of Patent: *Aug. 7, 2007

(54) DUAL DAMASCENE PROCESS

(75) Inventors: Bang-Chien Ho, Hsin-Chu (TW); Jian-Hong Chen, Hsin-Chu (TW); Tsang-Jiuh Wu, Taichung (TW); Li-Te Lin, Hsin-Chu (TW); Li-Chih Chao, Tao-Yuan (TW); Hua-Tai Lin, Yu-Kang (TW); Shyue-Sheng Lu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/915,633

(22) Filed: Aug. 10, 2004

(65) Prior Publication Data

US 2005/0014362 A1    Jan. 20, 2005

(51) Int. Cl.
*H01L 21/311* (2006.01)
(52) U.S. Cl. .............. 438/700; 438/702; 438/703
(58) Field of Classification Search .......... 438/725, 438/714, 692, 693, 700, 704, 734, 736, 740, 438/744, 637, 638, 702, 703, 723; 134/1.3; 216/13
See application file for complete search history.

(56) References Cited

U.S. PATENT DOCUMENTS

| 5,635,423 A | 6/1997 | Huang et al. ............ 437/195 |
| 5,920,790 A | 7/1999 | Wetzel et al. ............ 438/618 |
| 6,033,977 A | 3/2000 | Gutsche et al. ........... 438/618 |
| 6,057,239 A | 5/2000 | Wang et al. .............. 438/689 |
| 6,096,655 A | 8/2000 | Lee et al. ................ 438/700 |
| 6,268,283 B1 | 7/2001 | Huang .................... 438/638 |
| 6,329,118 B1 * | 12/2001 | Hussein et al. .......... 430/270.1 |
| 6,362,093 B1 | 3/2002 | Jang et al. .............. 438/633 |

(Continued)

FOREIGN PATENT DOCUMENTS

JP          399164          7/1989

(Continued)

OTHER PUBLICATIONS

Brewer Science, Inc. Receiving National Tibbetts Award from U.S. Small Business Administration, Jan. 2001.

*Primary Examiner*—Parviz Hassanzadeh
*Assistant Examiner*—Roberts Culbert
(74) *Attorney, Agent, or Firm*—Thomas, Kayden, Horstemeyer & Risley

(57) ABSTRACT

A method of fabricating semiconductor devices using dual damascene processes to form plugs in the via holes composed of various high etch materials and bottom anti-reflection coating (BARC) materials. After via hole etch, a layer of high etch rate plug material is spin coated to fill the via holes. Next, a layer of photoresist is applied. The photoresist is then exposed through a mask and developed to form an etch opening. Using the remaining photoresist as an etch mask and with a bottom anti-reflection coating (BARC) as protection, the oxide or low k layer is etched to form subsequent wiring. The etch step is known as a damascene etch step. The remaining photoresist is removed and the trench/via openings are filled with metal forming inlaid metal interconnect wiring and contact vias.

20 Claims, 15 Drawing Sheets

U.S. PATENT DOCUMENTS

| | | | |
|---|---|---|---|
| 6,365,529 B1 * | 4/2002 | Hussein et al. | 438/780 |
| 6,426,298 B1 * | 7/2002 | Chen et al. | 438/699 |
| 6,465,358 B1 * | 10/2002 | Nashner et al. | 438/700 |
| 6,720,256 B1 * | 4/2004 | Wu et al. | 438/638 |
| 7,015,136 B2 * | 3/2006 | Bao et al. | 438/638 |
| 7,109,119 B2 * | 9/2006 | Bao et al. | 438/700 |
| 2001/0055725 A1 | 12/2001 | Hussein et al. | 430/270.1 |
| 2002/0173079 A1 | 11/2002 | Kaltalioglu | 438/118 |
| 2004/0087164 A1 * | 5/2004 | Bao et al. | 438/694 |

FOREIGN PATENT DOCUMENTS

JP     223755     8/1998

* cited by examiner

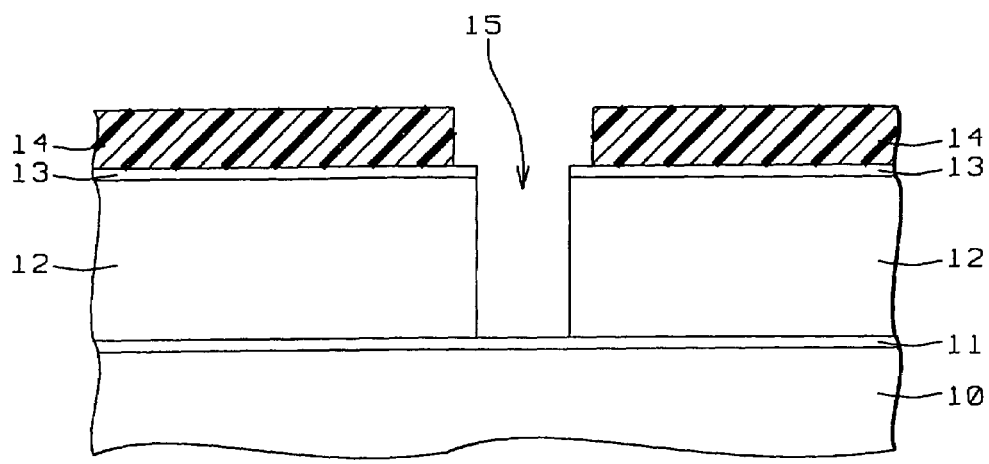
FIG. 1A – Prior Art
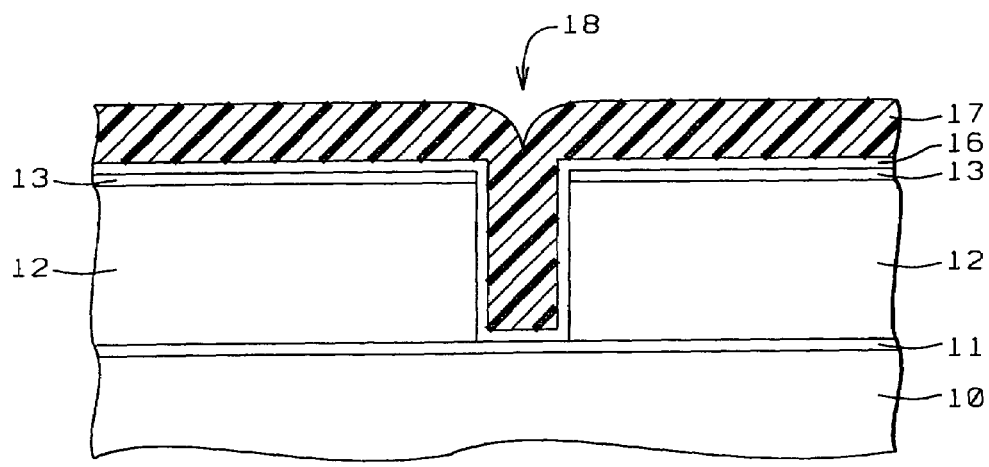
FIG. 1B – Prior Art

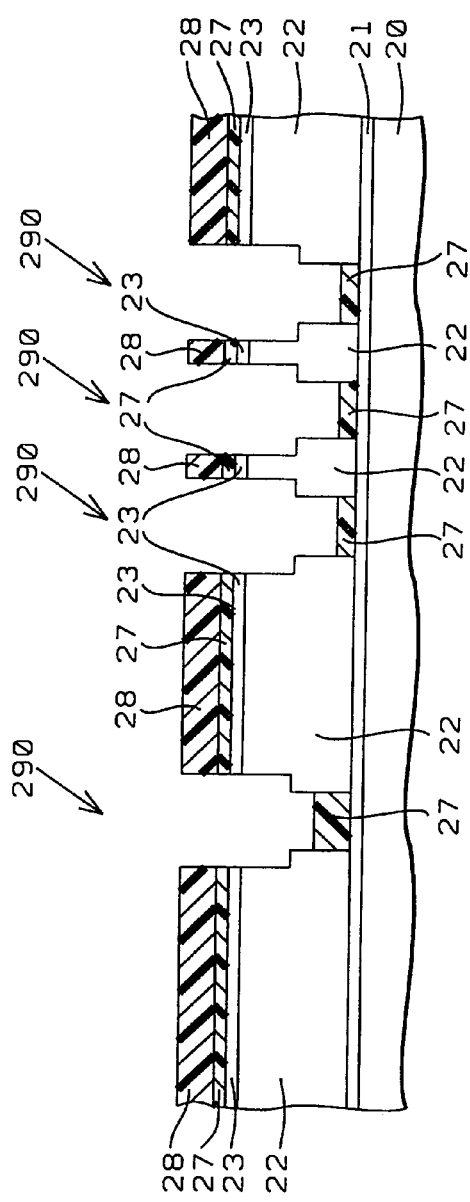
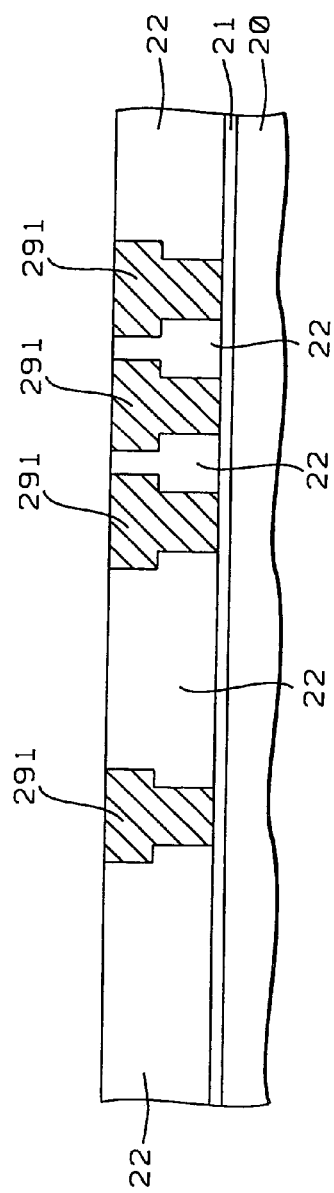

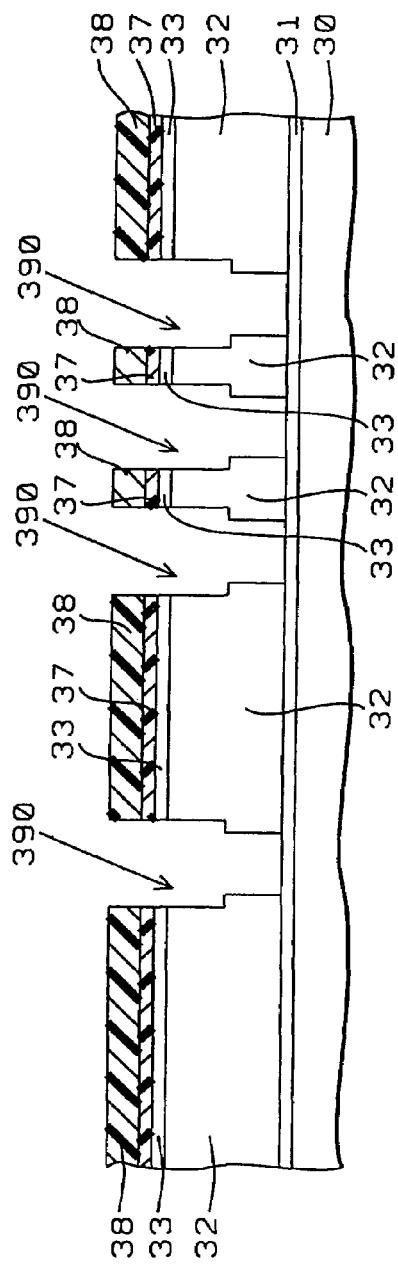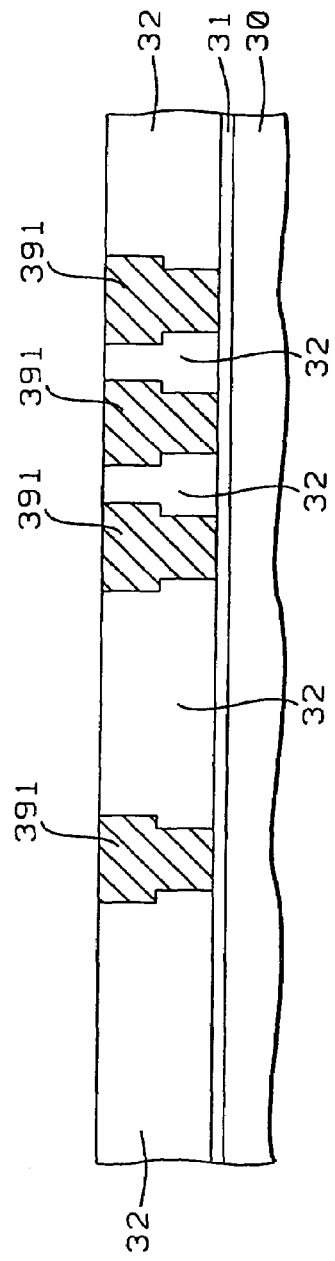
FIG. 3G
FIG. 3H

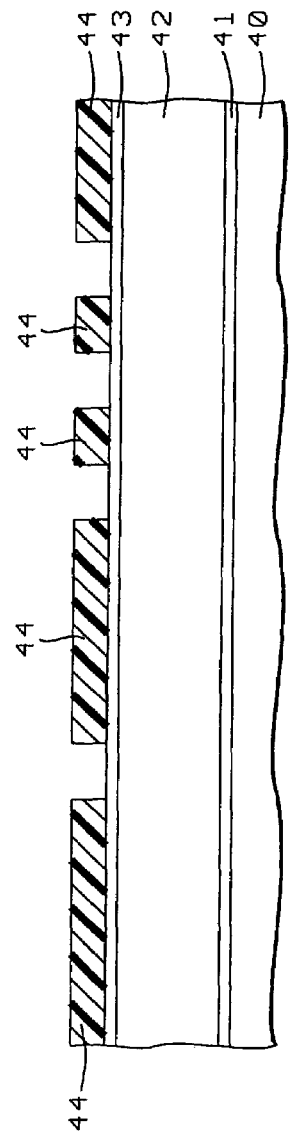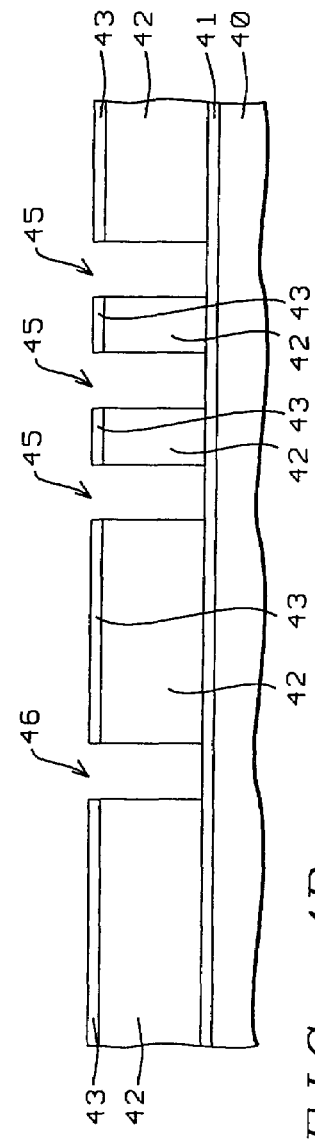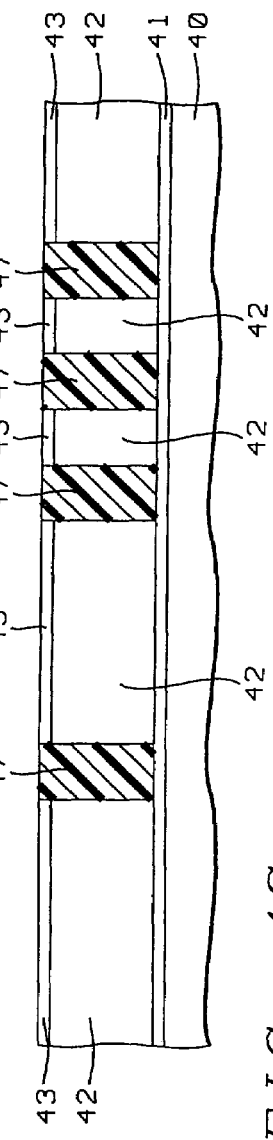

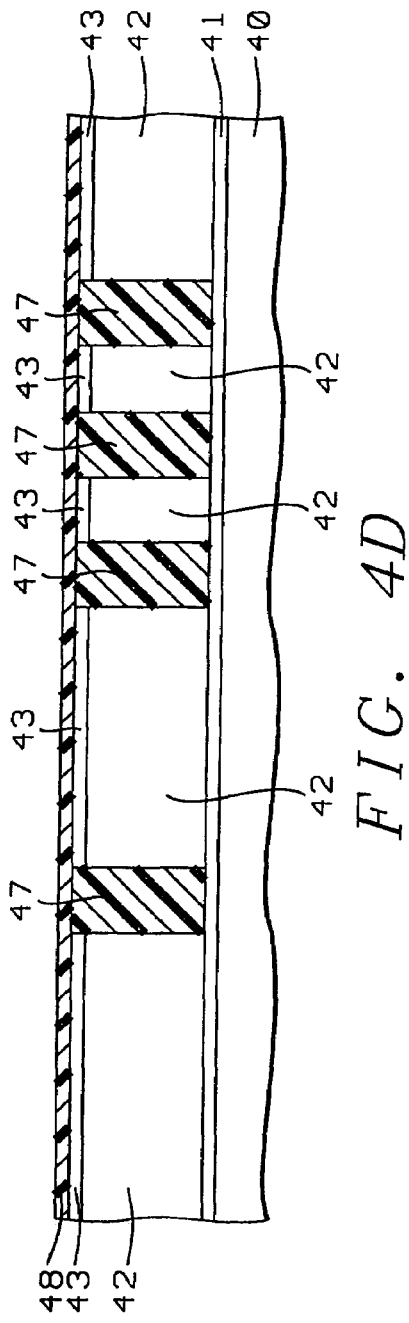
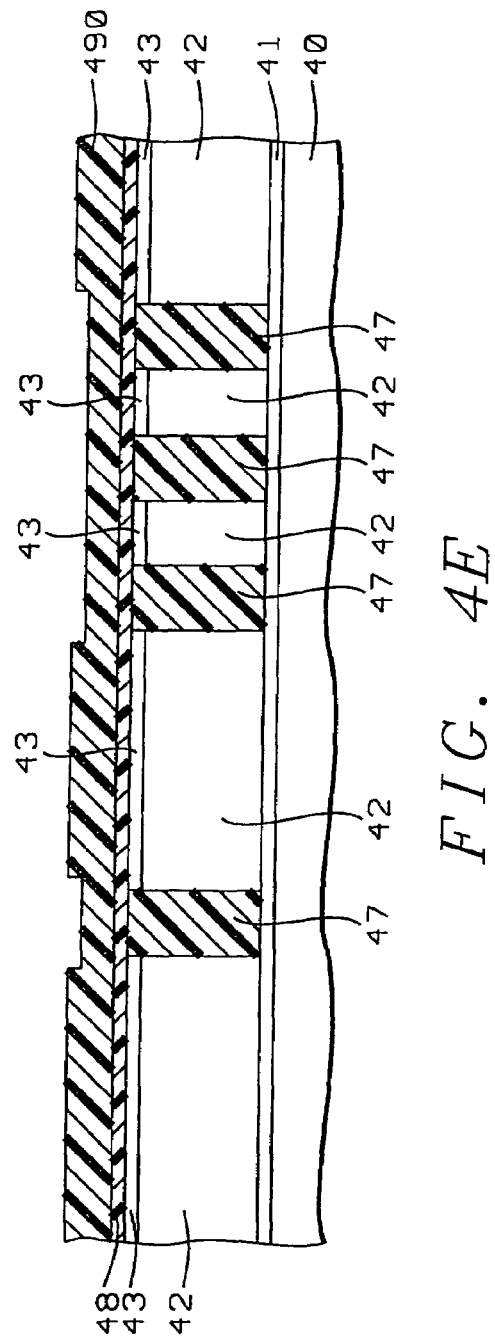

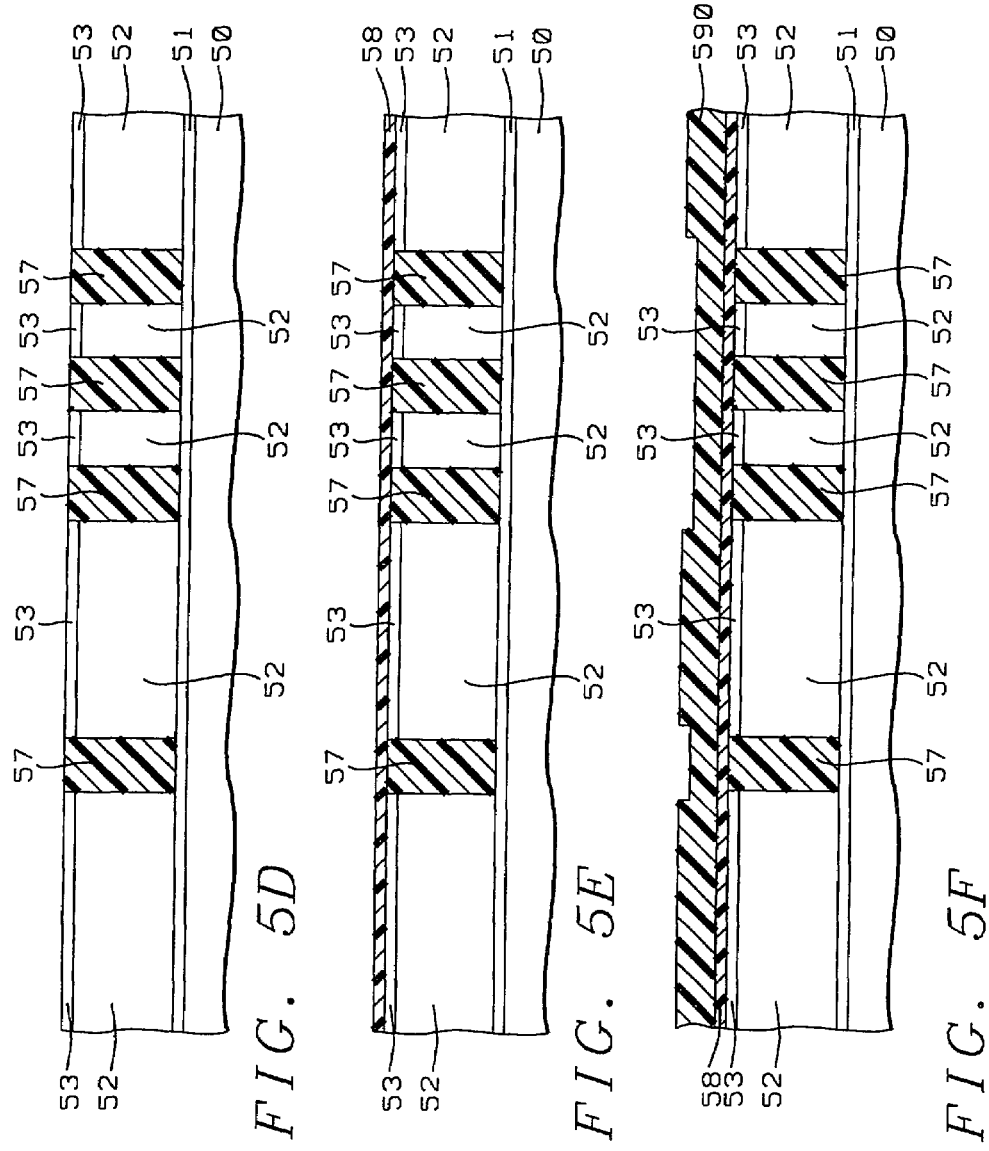

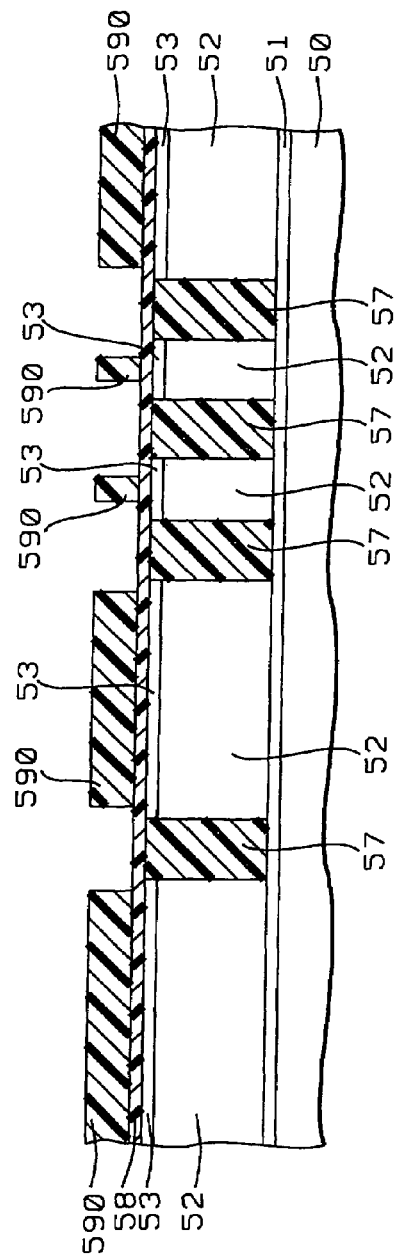
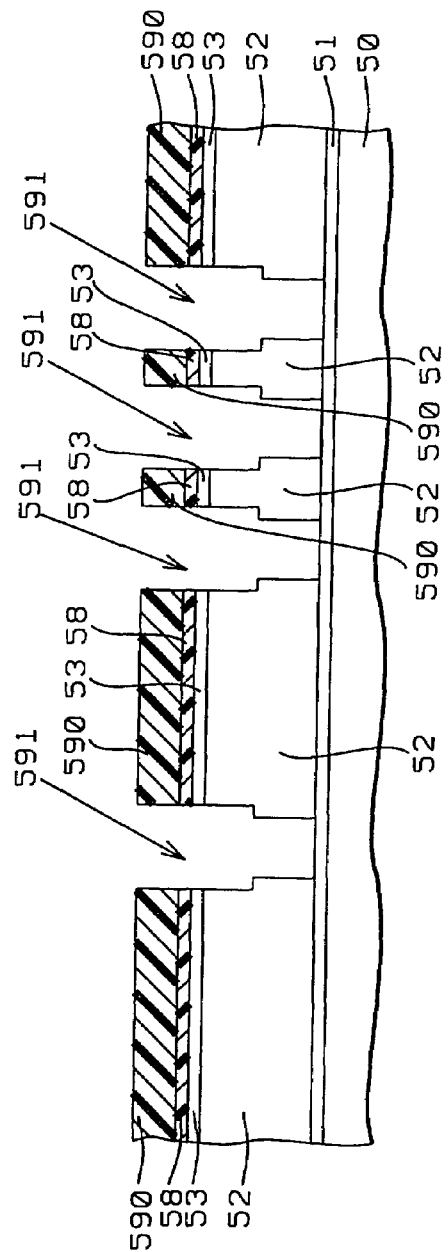

DUAL DAMASCENE PROCESS

BACKGROUND OF THE INVENTION (1) Field of the Invention

This invention relates to a method of fabricating semiconductor devices using dual damascene processes to form plugs in the via holes composed of various high etch rate materials and bottom anti-reflection coating (BARC) materials.

(2) Description of Related Art

Related Prior Art background patents will now be described in this section.

U.S. Pat. No. 6,057,239 entitled "Dual Damascene Process Using Sacrificial Spin-on Materials" granted May 2, 2000 to Wang et al. shows a dual damascene process with a sacrificial plug. The dual damascene process includes the steps of forming a contact hole in an oxide layer disposed above a semiconductor substrate, disposing a layer of anti-reflective coating material on top of the oxide layer and in the contact hole, and partially etching the layer of anti-reflective coating material and the oxide layer to form the wiring trough. The partial etching step includes the steps of spin coating photoresist on top of the anti-reflective coating material, exposing the photoresist through a mask containing a pattern of the wiring trough, developing the photoresist to expose portions of the anti-reflective coating material, dry etching the exposed portions of the anti-reflective coating material to expose portions of the oxide layer, and wet etching the exposed portions of the oxide layer to form the wiring trough.

U.S. Pat. No. 6,268,283 B1 entitled "Method for Forming Dual Damascene Structure" granted Jul. 31, 2001 to Huang teaches a dual damascene process with a resist cap in the dual damascene opening. A via opening of the dual damascene structure is formed in a dielectric layer. A non-conformal cap layer is then formed on the substrate before the step of defining the photoresist layer. The non-conformal cap layer only covers the top region of the trench but does not fill the trench. A patterned photoresist layer is then formed on the substrate followed by an etching procedure so as to form a trench. The photoresist layer is then removed. The trench and via opening are filled with a conductive layer. Thereafter, redundant portions of the conductive layer are removed by a planarization process.

U.S. Pat. No. 6,033,977 entitled "Dual Damascene Structure" granted Mar. 7, 2000 to Gutsche et al. discloses a dual damascene process with a sacrificial plug. The method for manufacturing a dual damascene structure includes the use of a sacrificial stud and provides a defined edge on the interface between the conductive line openings and the via openings.

U.S. Pat. No. 5,635,423 entitled "Simplified Dual Damascene Process for Multi-level Metallization and Interconnection Structure" granted Jun. 3, 1997 to Huang et al. shows a semiconductor device containing an interconnection structure having a reduced inter-wiring spacing produced by a modified dual damascene process. In one embodiment, an opening for a via is initially formed in a second insulating layer above a first insulating layer with an etch stop layer between layers. A larger opening for a trench is then formed in the second insulating layer, while simultaneously extending the via opening through the etch stop layer and first insulating layer. The trench and via are then simultaneously filled with conductive material.

U.S. Pat. No. 6,096,655 entitled "Method for Forming Vias and Trenches in an Insulation Layer for a Dual Damascene Multilevel Interconnection Structure" granted Aug. 1, 2000 to Lee et al. discloses dual damascene processes for multilevel interconnection using a method for forming trenches and vias in the inter-insulation without etching out the inter-insulation layer. A thick sacrificial layer is first deposited and reversed etched to form sacrificial pillars forming the vias and sacrificial bridges forming the trenches. The sacrificial layer can be any material (insulator, semiconductor, or metal), provided it can be easily patterned and selectively removed later over the inter insulator layer. Thereafter, a low-k inter-insulation layer is deposited around the sacrificial pillars and bridges. It is these sacrificial pillars and bridges that are etched away leaving behind vias and trenches in the inter-insulation layer. In a preferred embodiment, a silicon film, either amorphous or polycrystalline, is used as the sacrificial layer.

U.S. Pat. No. 5,920,790 entitled "Method of Forming a Semiconductor Device Having Dual Inlaid Structure" granted Jul. 6, 1999 to Wetzel et al. teaches a dual damascene method for forming a semiconductor device that includes providing a substrate having a metal interconnect, depositing a via interlevel dielectric (ILD) layer over the substrate and the metal interconnect, and then etching the via ILD layer to form a via over the metal interconnect. This is then followed by depositing a trench ILD layer over the via ILD layer and the via, etching the trench ILD layer to form a trench. Finally, metal is deposited so as to fill the via and the trench, and provide electrical connection with the metal interconnect.

SUMMARY OF THE INVENTION

This invention relates to a method of fabricating semiconductor devices using dual damascene processes to form plugs in the via holes composed of various high etch rate materials and bottom anti-reflection coating (BARC) materials.

In the first embodiment of the present invention a dual damascene process, termed the "full fill process", wherein via holes are filled with a high etch rate material by spin coating, and simultaneously the interlevel dielectric (ILD) layer is coated with a thin layer of high etch rate material. Key to this process is controlling the spin coating process itself of the high etch rate material, and thus, the thickness of this bottom anti-reflection coating (BARC) upon the interlevel dielectric (ILD) and over the vias is controlled.

In the second embodiment of the present invention a dual damascene process, wherein both the via holes are filled by spin coating and the interlevel dielectric (ILD) layer is simultaneously spin coated with a high etch rate material. Key to this process is controlling the thickness of this bottom anti-reflection coating (BARC) upon the interlevel dielectric (ILD) layer and over the vias by an etch back process or by a develop back process both using a timing device for process control.

In the third embodiment of the present invention a dual damascene process, wherein just the via holes are filled completely (planar with surface) by spin coating with a pure resin material, and by controlling the spin coating process itself, the thickness of resin is controlled. Then, a layer of bottom anti-reflection coating (BARC) is spin coated upon the interlevel dielectric (ILD) layer and over the vias, using thickness control methods.

In the fourth embodiment of the present invention a dual damascene process, wherein both the via holes are filled and interlevel dielectric (ILD) is spin coated with pure resin material and the thickness of this resin material is controlled by an etch back process, or by a develop back process using a timing device to remove the excess resin over the vias (planar with surface) and completely remove resin over the interlevel dielectric (ILD) layer. Then, a layer of bottom anti-reflection coating (BARC) is spin coated upon the interlevel dielectric (ILD) layer and over the vias using thickness control methods.

Following these aforementioned dual damascene processing variations, described in embodiments one through four of the present invention, conventional dual damascene metal fill and planarization steps follow for forming inlaid metal interconnects and contact vias.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include:

FIGS. 1A-B, which in cross-sectional representation illustrate Prior Art methods of forming damascene openings.

FIGS. 2A-G, which in cross-sectional representation illustrate the first embodiment of the present invention a dual damascene process, termed the "full fill process", wherein via holes are filled with a high etch rate material by spin coating, and simultaneously the interlevel dielectric (ILD) layer is coated with a thin layer of high etch rate material, using thickness process controls in spin coating.

FIGS. 3A-H, which in cross-sectional representation illustrate the second embodiment of the present invention a dual damascene process, wherein both the via holes are filled by spin coating and the interlevel dielectric (ILD) layer is simultaneously spin coated with a high etch rate material, and then etching back or developing back excess material.

FIGS. 4A-H, which in cross-sectional representation illustrate the third embodiment of the present invention a dual damascene process, wherein just the via holes are filled completely (planar with surface) by spin coating with a pure resin material, and by controlling the spin coating process itself, the thickness of resin is controlled.

FIGS. 5A-I, which in cross-sectional representation illustrate the fourth embodiment of the present invention a dual damascene process, wherein both the via holes are filled and interlevel dielectric (ILD) is spin coated with pure resin material and the thickness of this resin material is controlled by an etch back process, or by a develop back process.

DESCRIPTION OF THE PREFERRED EMBODIMENTS

Figure 2A:
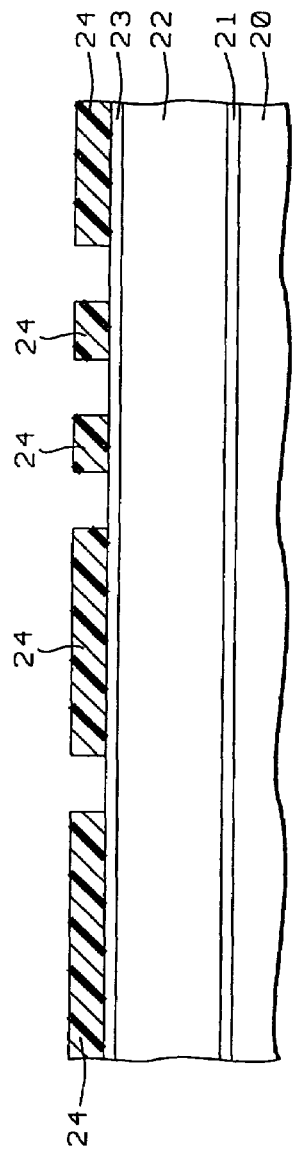

This invention relates to a method of fabricating semiconductor devices using dual damascene processes to form plugs in the via holes composed of various high etch rate materials and bottom anti-reflection coating (BARC) materials.

FIGS. 1A-B, which in cross-sectional representation illustrate Prior Art methods of forming damascene openings. With reference to FIG. 1A, this is a cross-sectional representation of a Prior Art method of forming a damascene opening. The substrate 10 is a semiconductor material, single crystal Si, Ge, or GaAs, or it is a module with integrated circuits thereon. An etch stop layer 11 is formed over the substrate 10. Next, an interlevel dielectric layer 12 (ILD) is formed over the etch stop layer 11 and this interlevel dielectric 12 is usually a low k, dielectric constant, insulator. An inorganic anti-reflective coating 13 (ARC) is formed over the interlevel dielectric layer 12. Next, a photoresist coating 14 is formed over the inorganic anti-reflective coating 13. This photoresist coating 14 is exposed, developed and patterned to form via openings 15 (arrow) and the via openings 15 are formed by etching away exposed anti-reflective coating 13 and interlevel dielectric 12. The process described above illustrates a conventional Prior Art method or process to form a via opening in a dual damascene process, which in subsequent process steps, form trench/via openings.

Again with refer to FIG. 1A, some of the problems associated with the Prior Art process described above are the following:

(a) Poisoning of the low k dielectric 12 by the photoresist 14 occurs, since the inorganic anti-reflective coating 13 does not protect the low k dielectric 12 from this problem.

(b) Upon subsequent trench definition and formation, the thickness of the photoresist 14 varies due to the varying topography on the substrate and this causes difficulty in controlling critical dimensions (CD).

(c) Note in FIG. 1A, that no photoresist 14, remains in the via opening 15, and in subsequent processing steps for forming the trench opening, namely, developing photoresist and in etching for the trench, damage can occur in the via profile.

With reference to FIG. 1B, this is a cross-sectional representation of a Prior Art method of forming a damascene opening. Figure features labeled 10 through 13 are common for both FIG. 1A and FIG. 1B. With reference to FIG. 1B, specifically, the substrate 10 is a semiconductor material, single crystal Si, Ge, or GaAs, with integrated circuits thereon. An etch stop layer 11 is formed over the substrate 10. Next, an interlevel dielectric layer 12 (ILD) is formed over the etch stop layer 11 and this interlevel dielectric 12 is usually a low k, dielectric constant, insulator. An inorganic anti-reflective coating 13 (ARC) is formed over the interlevel dielectric layer 12. Next, a poisoning preventive layer 16, is formed which in the via region 18 (arrow) and over the interlevel dielectric 12. Next, a photoresist layer 17 for subsequent trench formation is formed over the poisoning preventive layer 16, and note the photoresist layer 17, dips or goes down into the via region 18.

Again with refer to FIG. 1B, Prior Art, the process described above are the basic processing steps prior to the subsequent photoresist patterning for trench formation, in a dual damascene trench/via opening process. Some of the problems associated with the Prior Art process described above are the following:

In subsequent process steps, after exposure and develop of the photoresist layer 17 for trench formation, the low k dielectric or insulator 12 causes poisoning of the photoresist layer 17, due to diffusion from the low k insulator 12 to the photoresist layer 17. In this case the poisoning preventive layer 16 failed to prevent poisoning of the photoresist layer 17, by diffusion from the low k insulator 12 to the photoresist layer 16.

Again with refer to FIGS. 1 A-B, which in cross-sectional representation illustrate Prior Art methods of forming damascene openings and adding to the above description. If additional processing methods are used, such as, forming plug material in the via opening for added protection of the via openings and better process control, the following problems remain:

(a) The plug material thickness has a bias problem between isolated and densely populated via hole regions caused by photoresist thickness variations or differential making critical dimension control difficult.
(b) Photoresist poisoning problems persist on low k insulator material.
(c) Furthermore, if the plug material described in the via opening is made too thick, a "fence" will form in the via in subsequent trench etching steps.

In a brief summary of Prior Art methods, the following problems occur: fencing, critical dimensional control, CD in crowded, closely spaced regions of chip versus isolated sparely populated openly spaced regions, anti-reflective coating (ARC) problems in trench/via cause deleterious reflections from above and below features on the substrate, etc. interfering with photolithography imaging.

FIGS. 2A-G, which in cross-sectional representation illustrate the first embodiment of the present invention a dual damascene process, termed the "full fill process", wherein via holes are filled with a high etch rate material by spin coating, and simultaneously the interlevel dielectric (ILD) layer is coated with a thin layer of high etch rate material. Key to this process is controlling the spin coating process itself of the high etch rate material, and thus, the thickness of this bottom anti-reflection coating (BARC) upon the interlevel dielectric (ILD) and over the vias is controlled.

With reference to FIG. 2A, the substrate 20 is a semiconductor material, single crystal Si, Ge, or GaAs, with integrated circuits thereon. An etch stop layer 21 is formed over the substrate 20. Next, an interlevel dielectric layer 22 (ILD) is formed over the etch stop layer 21 and this interlevel dielectric 22 is usually a low k, dielectric constant, insulator. The etch stop layer 21, which is over the substrate, is selected from the group consisting of silicon nitride, silicon oxynitride, and silicon carbide, with an approximate thickness range from 300 to 1,000 Angstroms. An inorganic anti-reflective coating 23 (ARC), the first ARC layer, is formed over the interlevel dielectric layer 22. The first anti-reflective coating 23 over the interlevel dielectric layer 22 is an inorganic material selected from the group consisting of silicon nitride, silicon oxynitride, and silicon carbide, with an approximate thickness range from 300 to 1,000 Angstroms. Next, a photoresist coating 24 is formed over the inorganic anti-reflective coating 23. This photoresist coating 24 is exposed, developed and patterned to form via openings, in subsequent etching steps.

Figure 2B:
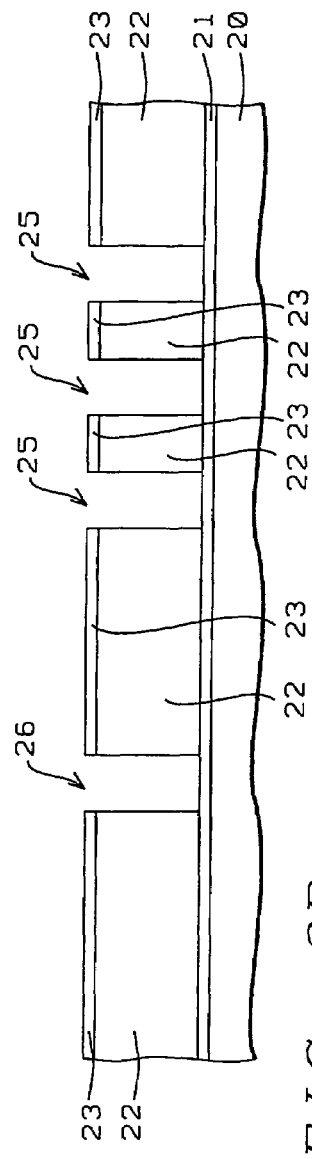

With reference to FIG. 2B, next in the process the interlevel dielectric 22 and inorganic anti-reflective coating 23 (ARC) are patterned by photoresist (see FIG. 2A, photoresist coating 24) and etched to form via openings 25 and 26. Closely spaced, dense via regions 25 (arrows) are formed, and simultaneously, widely spaced, isolated via opening 26 (arrow) are formed. The photoresist coating is stripped.

Figure 2C:
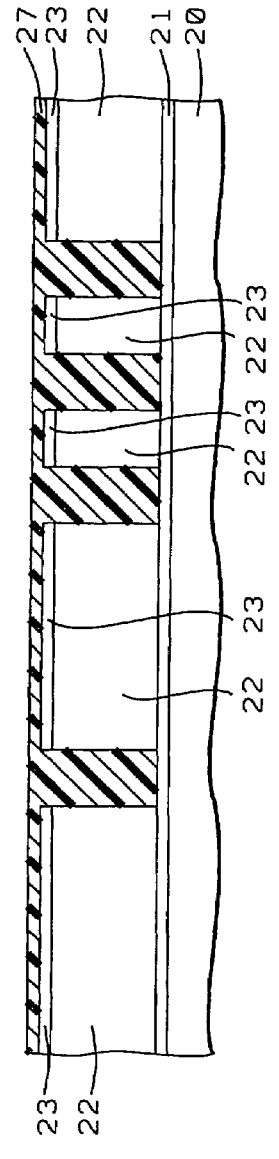

With reference to FIG. 2C, next in the process spin-on glass (SOG) via plug material 27 is applied over the patterned inorganic anti-reflective coating 23 and the etch stop layer 21 filling the via openings to form via plugs. The spin-on glass (SOG) via plug material 27 is comprised of pure resin or a new bottom anti-reflective material BARC, the second ARC layer used in the process. The pure resin material is an organic polymer with cross-linking compounds. Commercially available pure resin material is selected from the group consisting of Shipley ViPR material and TOK HEGF material. In addition, for this embodiment and the other embodiments of the present invention, the plug material is a high etch rate material compared with the etch rate of the interlevel dielectric, approximately 1.45 times that of interlevel dielectric, with an etch rate range of 1.3 to 1.6 times that of the interlevel dielectric, and therefore, for an optimum range, more specifically, where the etch rate for high etch rate plug material, termed Y, and the etch rate of interlevel dielectric layer, termed X, is then comprised of:
$Y \sim =1.0X < Y < 2 \times$, general equation range larger,
$Y \sim =1.1X < Y < 1.8 \times$, better properties range smaller,
$Y \sim =1.3X < Y < 1.6 \times$, best properties with optimum range.

The "top" anti-reflective coating 23 and the "bottom" etch stop layer 21 both form etch stop layers. Both the "top" anti-reflective coating 23 and the "bottom" etch stop layer 21 are selected from the group consisting of silicon nitride, silicon carbide, and silicon oxynitride. The "top" anti-reflective coating 23, over the interlevel dielectric layer 22, has an approximate thickness between 300 to 1,000 Angstroms thick. The via plug material 27 is controlled to have a thickness of approximately 1,000 Angstroms on the top surface over the anti-reflective coating 23. Key to this process, is that the thickness via plug material 27 is controlled by the coating process itself, by controlling the spin speed during coating.

The via plug material 27 itself forms an anti-reflective layer used in subsequent trench etching steps. Furthermore, the via plug material 27 is chosen so as to have a high etch rate in subsequent trench etching steps, and thus, this property eliminates the need for subsequent etch back steps.

Figure 2D:
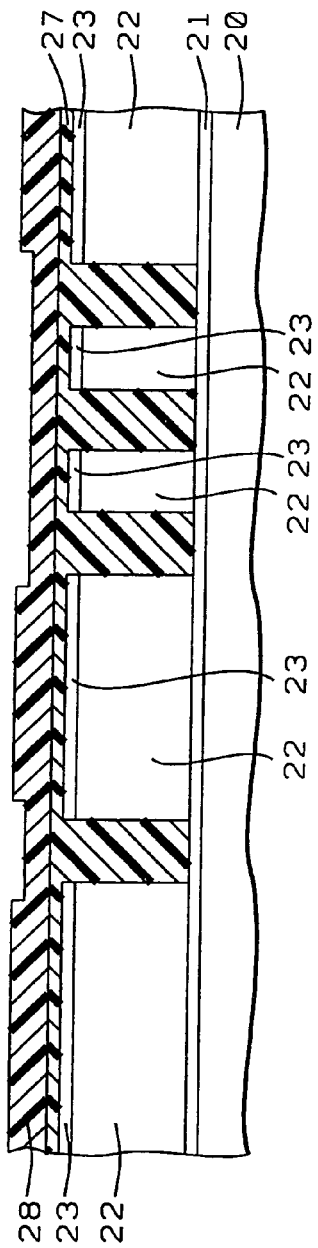

With reference to FIG. 2D, next in the process a layer of photoresist 28 is formed over the via plug material 27. Note, that the photoresist 28 does not contact the low k, interlevel dielectric 22 material and therefore, no poisoning occurs. Also note, that no photoresist topology issues or problems occur with this process and thus, good control of critical dimensions is achieved, as well as, providing protect against potential exposure of any underlying wiring metal to a plasma etching environment.

Figure 2E:
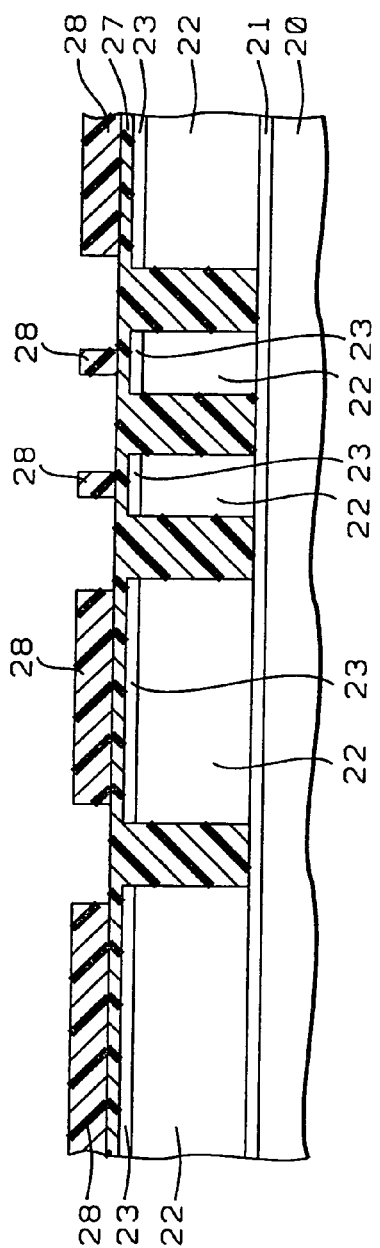

With reference to FIG. 2E, next in the process the layer of photoresist 28 is exposed and developed, patterning openings for subsequent trench formation.

With reference to FIG. 2F, next in the process the exposed layer of the low k, interlevel dielectric 22 material and exposed anti-reflective coating 23 are etched to form trench openings 290 (arrows). Some of the via plug material 27 remains partially in the via openings, for both densely and sparely populated via regions.

With reference to FIG. 2G, next in process the photoresist is completely stripped, the remaining via plus material is completely removed, and the anti-reflective coating is completely removed. The trench/via openings are filled by copper metal by copper plating methods, along with a copper diffusion barrier material and copper seed layer (both too thin to be shown in FIGS.) The excess copper metal is removed and the surface is planarized. The planarization method is selected from the group consisting of chemical-mechanical polishing, ion milling, milling, or etching techniques. Thus, in laid copper metal 291 is formed in the trench/via openings and the inlaid copper metal forms conductive interconnect wiring and contact vias.

FIGS. 3A-H, which in cross-sectional representation illustrate the second embodiment of the present invention a dual damascene process, wherein both the via holes are filled by spin coating and the interlevel dielectric (ILD) layer is simultaneously spin coated with a high etch rate material. Key to this process is controlling the thickness of this bottom anti-reflection coating (BARC) upon the interlevel dielectric (ILD) layer and over the vias by an etch back process or by a develop back process both using a timing device for process control. The high etch rate material is a pure resin, which forms via plugs, and is satisfactory when the etch rate of the resin is between 1.3 to 1.6 times the etch rate of the low k dielectric etch rate. However, for optimum best performance, the high etch rate material, resin via plug material, is best when the etch rate of the resin is approximately about 1.45 times (or near one and one-half times) the etch rate of the low k dielectric etch rate.

Figure 3A:
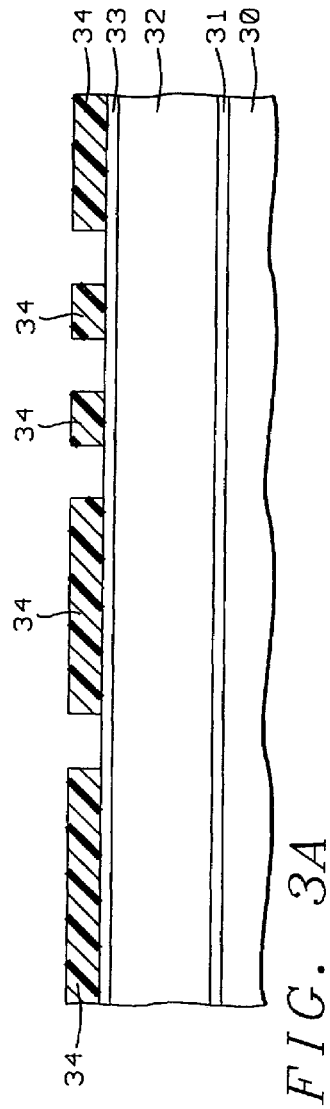

With reference to FIG. 3A, the substrate 30 is a semiconductor material, single crystal Si, Ge, or GaAs, with integrated circuits thereon. An etch stop layer 31 is formed over the substrate 30. Next, an interlevel dielectric layer 32 (ILD) is formed over the etch stop layer 31 and this interlevel dielectric 32 is usually a low k, dielectric constant, insulator. An inorganic anti-reflective coating 33 (ARC), the first ARC layer, is formed over the interlevel dielectric layer 32. Next, a photoresist coating 34 is formed over the inorganic anti-reflective coating 33. This photoresist coating 34 is exposed, developed and patterned to form via openings, in subsequent etching steps.

Furthermore, for this embodiment and the other embodiments of the present invention, the interlevel dielectric layer, ILD, is comprised of low k dielectric constant material selected from the group consisting of undoped silicon dioxide or silicon oxide, doped silicon dioxide or silicon oxide with fluorine dopant, low dielectric constant organic polymers, highly fluorinated materials, porous materials, spin-on glass SOG, chemical vapor deposited glass, and spin-on dielectric SOD.

Figure 3B:
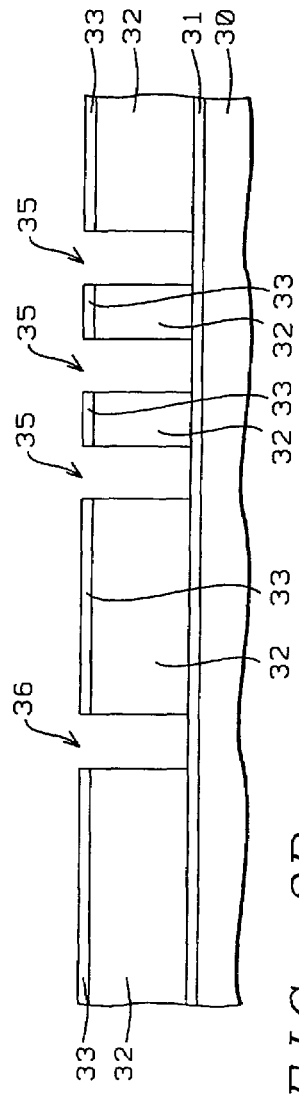

With reference to FIG. 3B, next in the process the interlevel dielectric 32 and inorganic anti-reflective coating 33 (ARC) are patterned by photoresist and etched to form via openings 35 and 36. Closely spaced, dense via regions 35 (arrows) are formed, and simultaneously, widely spaced, isolated via opening 36 (arrow) are formed.

Figure 3C:
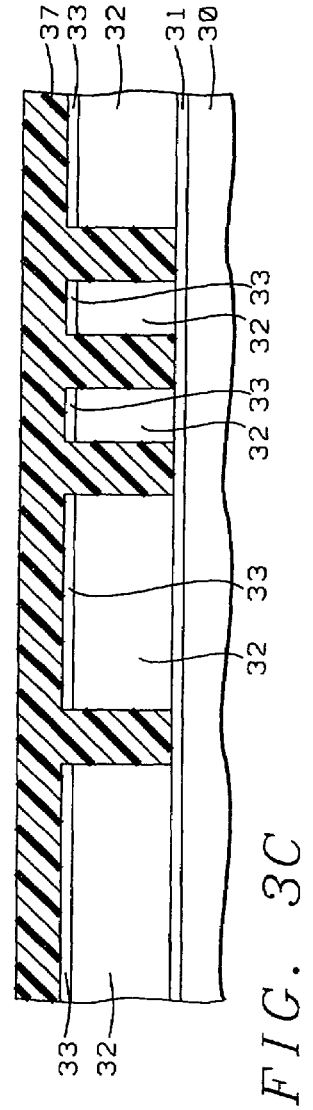

With reference to FIG. 3C, next in the process a thick coating of BARC, bottom anti-reflective coating material 37, is coated over the patterned inorganic anti-reflective coating 33 (first ARC layer) and the etch stop layer 31, filling the via openings to form via plugs. In addition, for this embodiment and the other embodiments of the present invention, the BARC, bottom anti-reflective coating material is selected from the group consisting of organic polymer mixtures with thermally cross-linking polymer resins, mixed with dyes, both the dyes and/or intrinsically light absorbing polymers, are used in the BARC, with the thickness of the BARC controlled to approximately 1,000 Angstroms or less. The BARC, bottom anti-reflective coating material is a commercially available material selected from the group consisting of Brewer Science ARC25, Brewer Science DUV42-p, Honeywell Duo 193, Honeywell Duo 248, and Shipley AR-xx Series. Moreover, BARC thickness is controlled to less than 1,000 Angstroms by using "normal" TEL equipment settings of "ACT 8 or ACT 12".

Figures 3D, 3E, 3F:
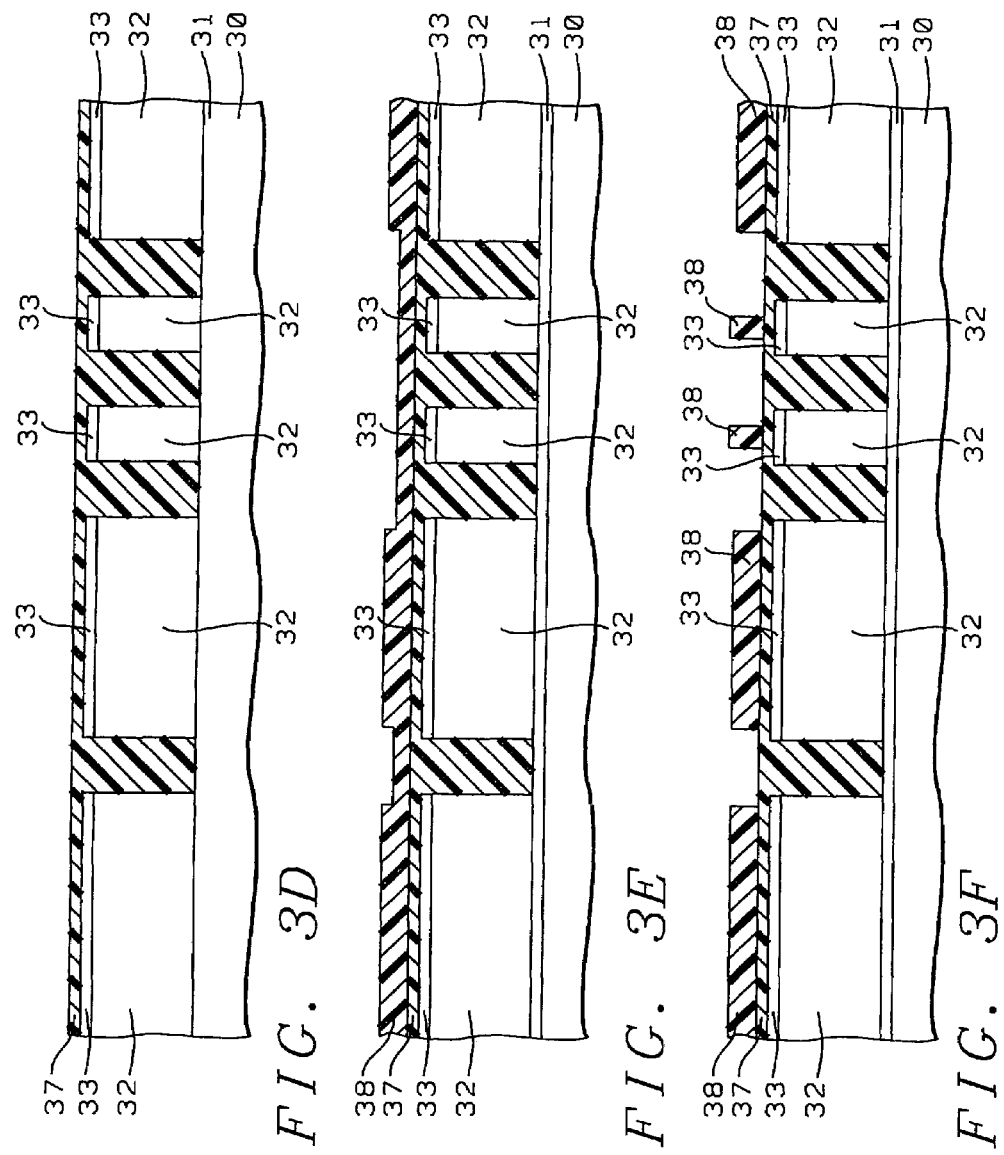

With reference to FIG. 3D, next in the process an etch back or develop back process step is used to control the thickness of the thick coating of BARC, bottom anti-reflective coating, material 37 over the patterned inorganic anti-reflective coating 33 (first ARC layer, which is on the inter-level dielectric 32) and over via plugs. The aforementioned etch back or develop back processes are controlled by a timer for thickness control. The bottom anti-reflective BARC material 37 layer is used in subsequent trench etching steps. Furthermore, this via plug material is chosen so as to have a high etch rate in subsequent trench etching steps, and thus, this property eliminates the need for subsequent etch back steps.

With reference to FIG. 3E, next in the process a layer of photoresist 38 is formed over the bottom anti-reflective BARC material 37 layer, which has formed via plugs. Note, that the photoresist 38 does not contact the low k, interlevel dielectric 32 material and therefore, no poisoning occurs. Note, that no photoresist topology issues or problems occur with this process and thus, good control of critical dimensions is achieved. Also note, that the resin material, BARC material 37 layer does not contact the low k dielectric, inter-level dielectric 32, thus no material poisoning occurs.

With reference to FIG. 3F, next in the process the layer of photoresist 38 is exposed and developed, patterning openings for subsequent trench formation.

With reference to FIG. 3G, next in the process the exposed BARC material, exposed layer of the low k, interlevel dielectric material and exposed anti-reflective coating (first ARC layer) are completely etched to form completely formed trench/via openings 390 (arrows), which are completely opened up, for dual damascene processing. Note, that in this embodiment no via plug material remains in the vias, for both densely and sparely populated via regions.

With reference to FIG. 3H, next in process the photoresist is completely stripped, the remaining BARC material and the anti-reflective coating (first ARC layer) are completely removed. The trench/via openings are filled by copper metal by copper plating methods, with copper diffusion barrier material and copper seed layer (both too thin to be shown in FIGS.) The excess copper metal is removed and the surface is planarized. The planarization method is selected from the group consisting of chemical-mechanical polishing, ion milling, milling, or etching techniques. Thus, in laid copper metal 391 is formed in the trench/via openings and the copper metal forms conductive interconnect wiring and contact vias.

FIGS. 4A-H, which in cross-sectional representation illustrate the third embodiment of the present invention a dual damascene process, wherein just the via holes are filled completely (planar with surface) by spin coating with a pure resin material, and by controlling the spin coating process itself, the thickness of resin is controlled. Then, a layer of bottom anti-reflection coating (BARC) is spin coated upon the interlevel dielectric (ILD) layer and over the vias, using thickness control methods.

With reference to FIG. 4A, the substrate 40 is a semiconductor material, single crystal Si, Ge, or GaAs, with integrated circuits thereon. An etch stop layer 41 is formed over the substrate 40. Next, an interlevel dielectric layer 42 (ILD) is formed over the etch stop layer 41 and this interlevel dielectric 42 is usually a low k, dielectric constant, insulator. An inorganic anti-reflective coating 43 (ARC), the first ARC layer, is formed over the interlevel dielectric layer 42. Next, a photoresist coating 44 is formed over the inorganic anti-reflective coating 43. This photoresist coating 44 is exposed, developed and patterned to form via openings, in subsequent etching steps.

With reference to FIG. 4B, next in the process the interlevel dielectric 42 and inorganic anti-reflective coating 43 (ARC) are patterned by photoresist and etched to form via openings 45 and 46. Closely spaced, dense via regions 45 (arrows) are formed, and simultaneously, widely spaced, isolated via opening 46 (arrow) are formed.

With reference to FIG. 4C, next in the process a coating of pure resin material 47 completely fills via openings, forming via plugs, and is planar with the surface. The pure resin material 47 uses the coating process itself to control resin thickness, by controlling the spin speed, and then heating for cross-linking.

With reference to FIG. 4D, next in the process a BARC layer, 48 is coated over ARC layer 43 (first ARC layer) and over the pure resin material 47 (via plugs) using thickness control methods. The BARC, bottom anti-reflective coating material is a commercially available material selected from the group consisting of Brewer Science ARC25, Brewer Science DUV42-p, Honeywell Duo 193, Honeywell Duo 248, and Shipley AR-xx Series. BARC thickness is controlled to less than 1,000 Angstroms, by using "normal" TEL equipment settings of "ACT 8 or ACT 12".

With reference to FIG. 4E, next in the process a layer of photoresist 490 is formed over the BARC layer, 48. Note, no poisoning occurs and no photoresist topology issues or problems occur with this process and thus, good control of critical dimensions is achieved.

Figure 4F:
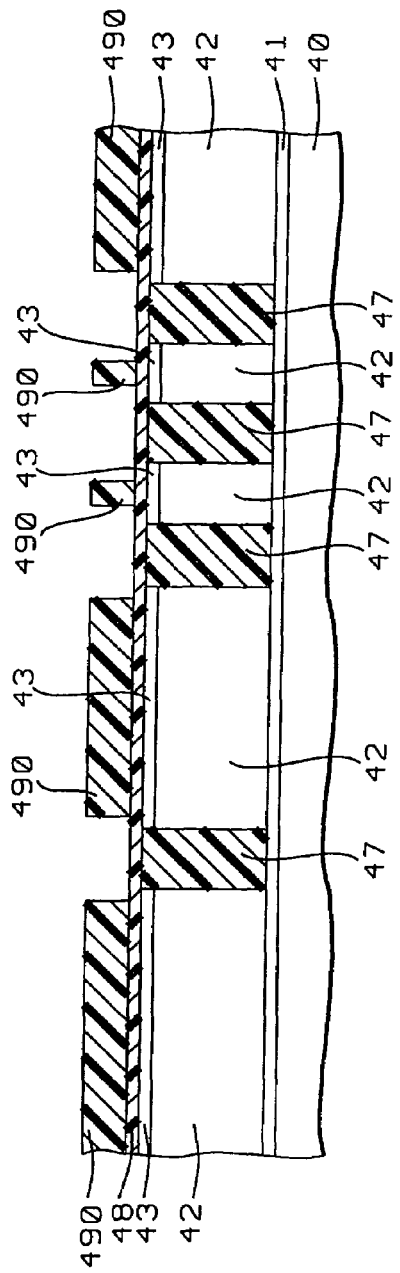

With reference to FIG. 4F, next in the process the layer of photoresist 490 is exposed and developed, patterning openings for subsequent trench formation.

Figure 4G:
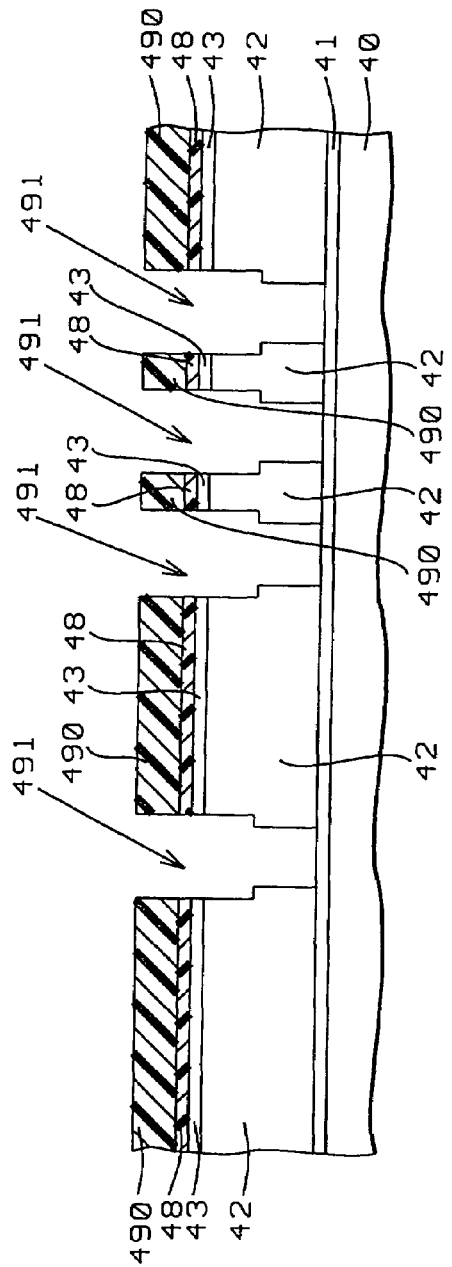

With reference to FIG. 4G, next in the process the exposed BARC material 48, exposed anti-reflective coating (first ARC layer), exposed pure resin material, which formed via plugs, and the exposed layer of the low k, interlevel dielectric material 42 are completely etched to form completely formed trench/via openings 491 (arrows), which are completely opened up, for dual damascene processing. Note, that in this embodiment no via plug material remains in the vias, for both densely and sparely populated via regions.

Figure 4H:
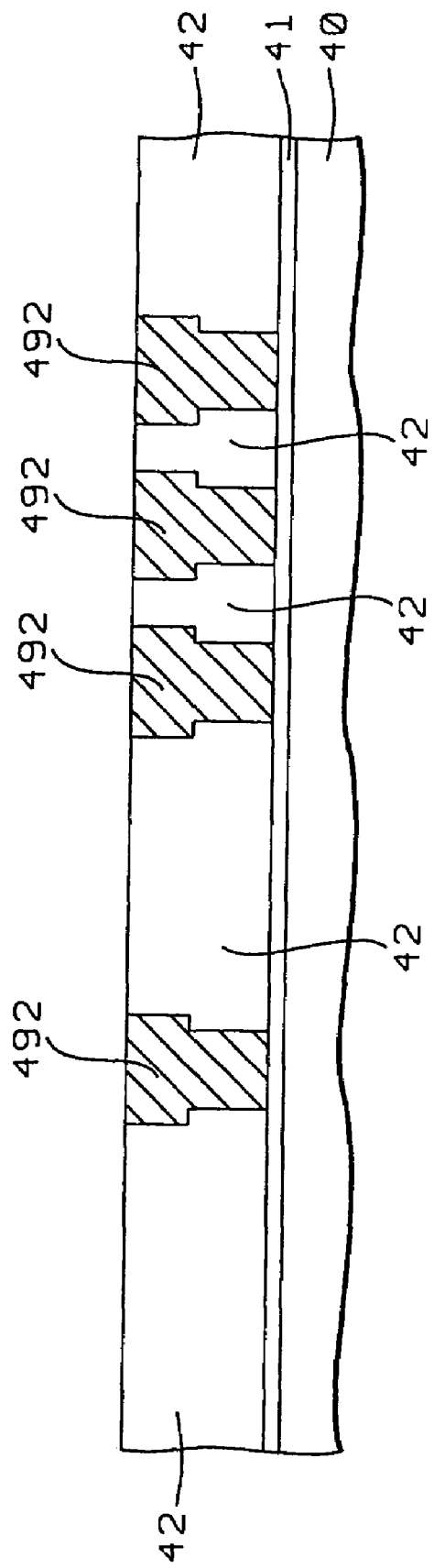

With reference to FIG. 4H, next in process the photoresist is completely stripped, and the remaining BARC material, and the anti-reflective coating (first ARC layer) material are completely removed. The trench/via openings are filled by copper metal by copper plating methods, with copper diffusion barrier material and copper seed layer (both too thin to be shown in FIGS.) The excess copper metal is removed and the surface is planarized. The planarization method is selected from the group consisting of chemical-mechanical polishing, ion milling, milling, or etching techniques. Thus, in laid copper metal 392 is formed in the trench/via openings and the copper metal forms conductive interconnect wiring and contact vias.

FIGS. 5A-I, which in cross-sectional representation illustrate the fourth embodiment of the present invention a dual damascene process, wherein both the via holes are filled and interlevel dielectric (ILD) is spin coated with thick pure resin material and the thickness of this resin material is controlled by an etch back process, or by a develop back process using a timing device to remove the excess resin over the vias (planar with surface) and completely remove resin over the interlevel dielectric (ILD) layer. Then, a layer of bottom anti-reflection coating (BARC) is spin coated upon the interlevel dielectric (ILD) layer and over the vias using thickness control methods.

Figure 5A:
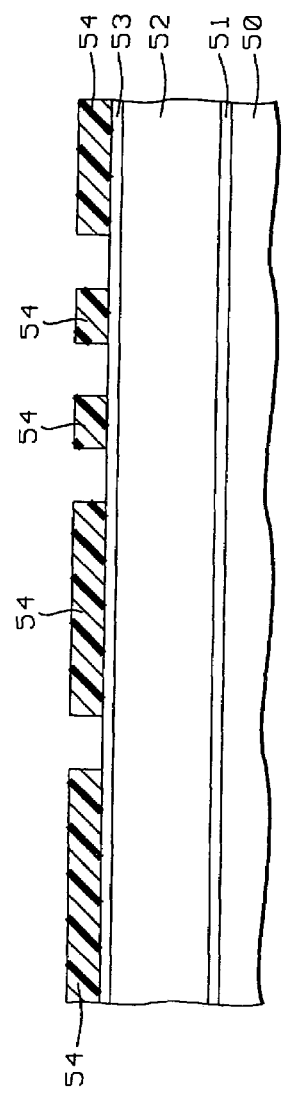

With reference to FIG. 5A, the substrate 50 is a semiconductor material, single crystal Si, Ge, or GaAs, with integrated circuits thereon. An etch stop layer 51 is formed over the substrate 50. Next, an interlevel dielectric layer 52 (ILD) is formed over the etch stop layer 51 and this interlevel dielectric 52 is usually a low k, dielectric constant, insulator. An inorganic anti-reflective coating 53 (ARC), the first ARC layer, is formed over the interlevel dielectric layer 52. Next, a photoresist coating 54 is formed over the inorganic anti-reflective coating 53. This photoresist coating 54 is exposed, developed and patterned to form via openings, in subsequent etching steps.

Figure 5B:
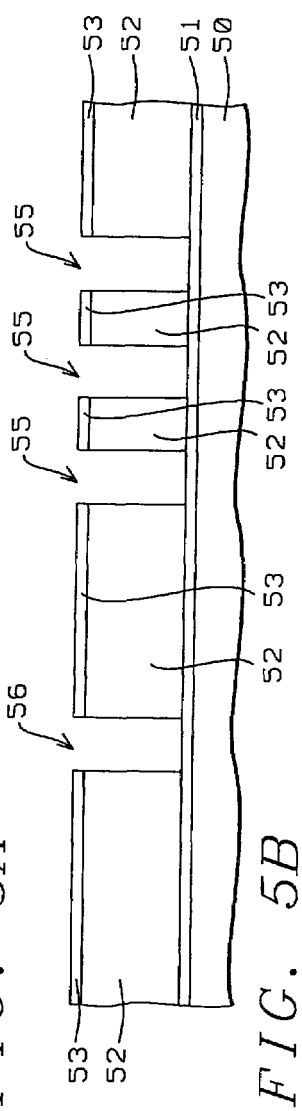

With reference to FIG. 5B, next in the process the interlevel dielectric 52 and inorganic anti-reflective coating 53 (ARC) are patterned by photoresist and etched to form via openings 55 and 56. Closely spaced, dense via regions 55 (arrows) are formed, and simultaneously, widely spaced, isolated via opening 56 (arrow) are formed.

Figure 5C:
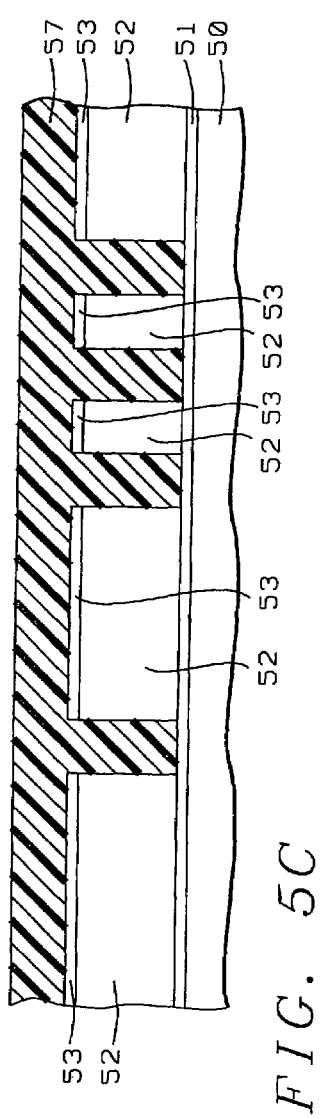

With reference to FIG. 5C, next in the process a thick coating of pure resin material 57 is coated over the patterned inorganic anti-reflective coating 53 (first ARC layer), over the etch stop layer 51, and filling the via openings.

With reference to FIG. 5D, next in the process an etch back or develop back process step is used to control the thickness of the thick coating of the pure resin material, removing resin over the patterned inorganic anti-reflective coating 53 and forming via plugs comprised of pure resin material 57, which is planar with the surface. The aforementioned etch back or develop back processes are controlled by a timer for thickness control. Furthermore, the pure resin material 57 for the via plugs is chosen so as to have a high etch rate in subsequent trench etching steps, and thus, this property eliminates the need for subsequent etch back steps.

With reference to FIG. 5E, next in the process a BARC layer, 58 is coated over patterned ARC layer 53 (first ARC layer) and over the patterned pure resin material 57 (via plugs) using thickness control methods.

With reference to FIG. 5F, next in the process a layer of photoresist 590 is formed over the BARC layer, 58. Note, no poisoning occurs and no photoresist topology issues or problems occur with this process and thus, good control of critical dimensions is achieved.

With reference to FIG. 5G, next in the process the layer of photoresist 590 is exposed and developed, patterning openings for subsequent trench formation.

With reference to FIG. 5H, next in the process the exposed BARC material 58, exposed anti-reflective coating (first ARC layer) 53, exposed pure resin material, which formed via plugs, and the exposed layer of the low k, interlevel dielectric material 52 are completely etched to form completely formed trench/via openings 591 (arrows), which are completely opened up, for dual damascene processing. Note, that in this embodiment no via plug material remains in the vias, for both densely and sparely populated via regions.

Figure 5I:
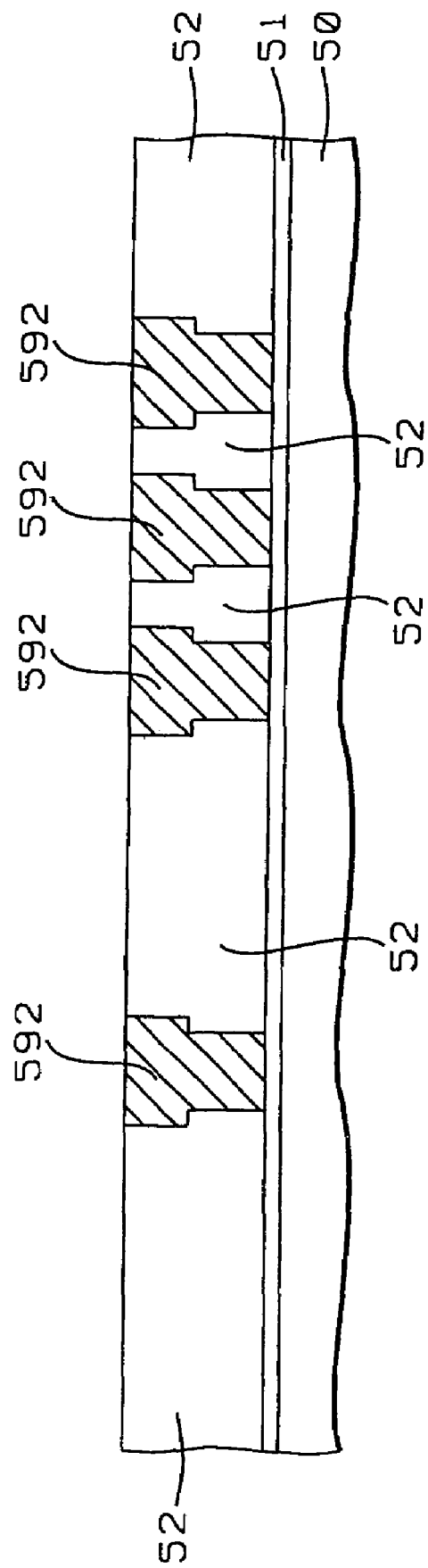

With reference to FIG. 5I, next in process the photoresist is completely stripped, and the remaining BARC material, and the anti-reflective coating (first ARC layer) material are completely removed. The trench/via openings are filled by copper metal by copper plating methods, with copper diffusion barrier material and copper seed layer (both too thin to be shown in FIGS.) The excess copper metal is removed and the surface is planarized. The planarization method is selected from the group consisting of chemical-mechanical polishing, ion milling, milling, or etching techniques. Thus, in laid copper metal 592 is formed in the trench/via openings and the copper metal forms conductive interconnect wiring and contact vias.

While the invention has been particularly shown and described with reference to the preferred embodiments thereof, it will be understood by those skilled in the art that various changes in form and details may be made without departing from the spirit and scope of the invention.

What is claimed is:

1. A method, for fabricating inlaid interconnect wiring and contact vias in integrated circuits using a dual damascene process, comprising:

providing a substrate;

forming an interlevel dielectric layer over the substrate;

patterning the interlevel dielectric layer forming via openings;

completely filling a plug material in each via opening, such that the upper surface of the interlevel dielectric layer is substantially planar with the plug material;

coating a bottom anti-reflective coating over the interlevel dielectric layer and the plug material;

etching the bottom anti-reflective coating, the underlying interlevel dielectric layer and the plug material, thereby forming a trench opening over each via opening and removing the plug material therein; and filling the trench/via openings with conducting metal forming the inlaid conducting interconnect wiring and contact vias.

2. The method of claim 1, wherein said substrate is a semiconductor material, single crystal Si, Ge, or GaAs, with integrated circuits thereon.

3. The method of claim 1, further forming an etch stop layer over the substrate prior to formation of the interlevel dielectric layer, wherein the etch stop layer over the substrate is selected from the group consisting of silicon nitride, silicon oxynitride, and silicon carbide, with an approximate thickness range from 300 to 1,000 Angstroms.

4. The method of claim 1, wherein the interlevel dielectric layer, ILD, is a low k dielectric constant material comprising doped silicon dioxide or silicon oxide with fluorine dopant, low dielectric constant organic polymers, highly fluorinated materials, porous materials, spin-on glass SOG, chemical vapor deposition glass, and spin-on dielectric SOD.

5. The method of claim 1, further forming a first anti-reflective coating over the interlevel dielectric layer, wherein the first anti-reflective coating over the interlevel dielectric layer is an inorganic material selected from the group consisting of silicon nitride, silicon oxynitride, and silicon carbide, with an approximate thickness range from 300 to 1,000 Angstroms.

6. The method of claim 1, wherein the plug material is a higher etch rate material, as compared to the etch rate of the interlevel dielectric layer, and the bottom anti-reflective coating has a thickness of less than 1,000 Angstroms.

7. The method of claim 1, wherein the plug material comprises organic polymers with cross-linking compounds, with the thickness controlled by controlling spin speed of a coating process.

8. The method of claim 1, wherein the BARC, bottom anti-reflective coating, comprises organic polymer mixtures with thermally cross-linking polymer resins, mixed with dyes, both the dyes and/or intrinsically light absorbing polymers, with the thickness of approximately 1,000 Angstroms or less.

9. The method of claim 1, wherein the plug material is a higher etch rate material compared with the etch rate of the interlevel dielectric layer, where the etch rate for higher etch rate plug material, termed Y, and the etch rate of interlevel dielectric layer, termed X, is then comprised of:

$1.0X < Y < 2X.$

10. The method of claim 1, wherein the conducting metal is comprised of copper deposited by electroplating.

11. A method, for fabricating inlaid interconnect wiring and contact vias in integrated circuits using a dual damascene process, comprising:

providing a substrate;
forming an interlevel dielectric layer over the substrate;
patterning the interlevel dielectric layer forming via openings;

applying a thick coating of plug material, over the interlevel dielectric layer, and filling the via openings;

etching back or developing to control the thickness of thick coating of plug material, completely removing the plug material over the interlevel dielectric layer, such that the upper surface of the interlevel dielectric layer is substantially planar with the plug material;

coating a bottom anti-reflective coating over the interlevel dielectric layer and the plug material;

etching the bottom anti-reflective coating and the underlying interlevel dielectric layer and the plug material, forming a trench opening over each via opening; and filling the trench/via openings with conducting metal forming the inlaid conducting interconnect wiring and contact vias.

12. The method of claim 11, wherein said substrate is a semiconductor material, single crystal Si, Ge, or GaAs, with integrated circuits thereon.

13. The method of claim 11, further forming an etch stop layer over the substrate prior to formation of the interlevel dielectric layer, wherein the etch stop layer over the substrate is selected from the group consisting of silicon nitride, silicon oxynitride, and silicon carbide, with an approximate thickness range from 300 to 1,000 Angstroms.

14. The method of claim 11, wherein the interlevel dielectric layer, ILD, is a low k dielectric constant material comprising doped silicon dioxide or silicon oxide with fluorine dopant, low dielectric constant organic polymers, highly fluorinated materials, porous materials, spin-on glass SOG, chemical vapor deposition glass, and spin-on dielectric SOD.

15. The method of claim 11, further forming a first anti-reflective coating over the interlevel dielectric layer, wherein the first anti-reflective coating over the interlevel dielectric layer is an inorganic material selected from the group consisting of silicon nitride, silicon oxynitride, and silicon carbide, with an approximate thickness range from 300 to 1,000 Angstroms.

16. The method of claim 11, wherein the plug material is a higher etch rate material, as compared to the etch rate of the interlevel dielectric layer, and the bottom anti-reflective coating has a thickness of less than 1,000 Angstroms.

17. The method of claim 11, wherein the plug material comprises organic polymers with cross-linking compounds, with the thickness controlled by controlling spin speed of a coating process.

18. The method of claim 11, wherein the BARC, bottom anti-reflective coating comprises organic polymer mixtures with thermally cross-linking polymer resins, mixed with dyes, both the dyes and/or intrinsically light absorbing polymers, with the thickness of approximately 1,000 Angstroms or less.

19. The method of claim 11, wherein the plug material is a higher etch rate material compared with the etch rate of the interlevel dielectric layer, where the etch rate for higher etch rate plug material, termed Y, and the etch rate of interlevel dielectric layer, termed X, is then comprised of:

$1.0X < Y < 2X.$

20. The method of claim 11, wherein the conducting metal is comprised of copper deposited by electroplating.

* * * * *